United States Patent [19]
Wachi

[11] Patent Number: 5,056,072
[45] Date of Patent: Oct. 8, 1991

[54] SEEK APPARATUS FOR OPTICAL DISC DRIVE

[75] Inventor: Shigeaki Wachi, Tokyo, Japan

[73] Assignee: Sony Corporation, Tokyo, Japan

[21] Appl. No.: 234,197

[22] Filed: Aug. 19, 1988

[30] Foreign Application Priority Data

Aug. 20, 1987 [JP] Japan .................. 62-206971

[51] Int. Cl.[5] ............................................. G11B 17/00
[52] U.S. Cl. ................................. 369/32; 360/78.06; 360/73.03
[58] Field of Search ............ 369/32; 360/78.06, 78.07, 360/78.12, 73.03

[56] References Cited

U.S. PATENT DOCUMENTS

| 4,333,117 | 6/1982 | Johnson | 360/78.07 |
|---|---|---|---|
| 4,491,776 | 1/1985 | Veale. | |
| 4,607,358 | 8/1986 | Maeda et al. | 369/32 X |
| 4,615,023 | 9/1986 | Inada et al. | 369/32 |
| 4,638,230 | 1/1987 | Lee | 360/78.06 X |
| 4,710,827 | 12/1987 | Okita | 360/73.03 X |
| 4,808,900 | 2/1989 | Ohlinger et al. | 360/78.07 X |
| 4,809,094 | 2/1989 | Akiyama | 360/76.07 X |
| 4,827,200 | 5/1989 | Ogura et al. | 360/78.07 |
| 4,899,234 | 2/1990 | Genheimer | 360/78.12 X |

FOREIGN PATENT DOCUMENTS 0176185 4/1986 European Pat. Off. .
0279478 11/1988 Japan .
2000612 1/1979 United Kingdom .

OTHER PUBLICATIONS

IEEE, "Magneto-Optical Mass Storage System with 130 mm Write-Once Disk Compatibility", 1987, pp. 92–97.

Primary Examiner—Roy N. Envail, Jr.
Assistant Examiner—Thang V. Tran
Attorney, Agent, or Firm—Hill, Van Santen, Steadman & Simpson

[57] ABSTRACT

An optical disc drive that employs a velocity feedback loop for detecting the moving velocity of an optical pickup, thereby to enable the optical pickup to seek a target recording track of an optical disc. The number of tracks to the target recording track is calculated on the basis of a signal derived from the optical pickup and a target velocity signal is supplied to the velocity feedback loop in accordance with the calculated result, whereby the moving velocity of the optical pickup can be controlled to become [0] at a timing (time point) at which the optical pickup reaches the target recording track.

5 Claims, 13 Drawing Sheets

F I G. 12A
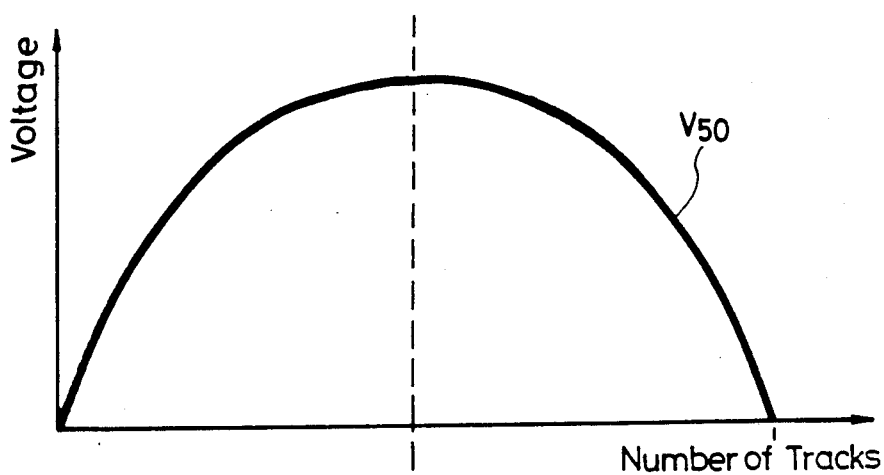
F I G. 12B
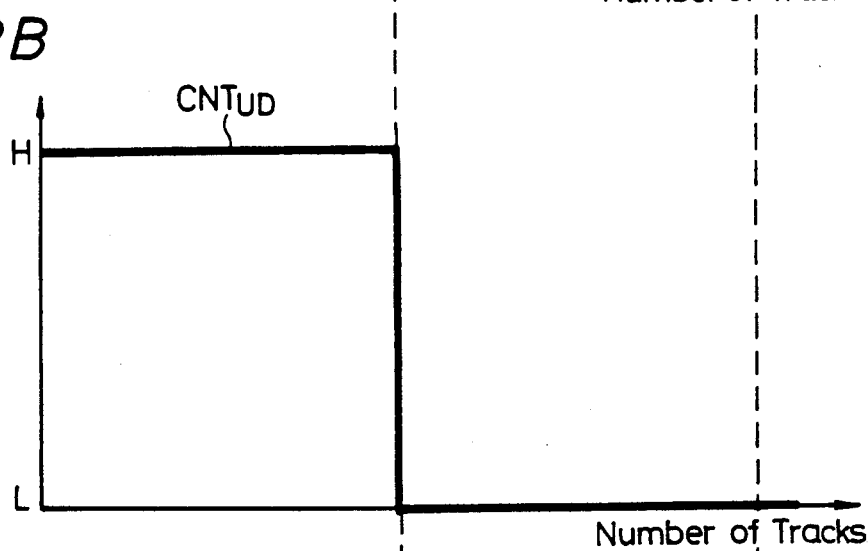
F I G. 12C
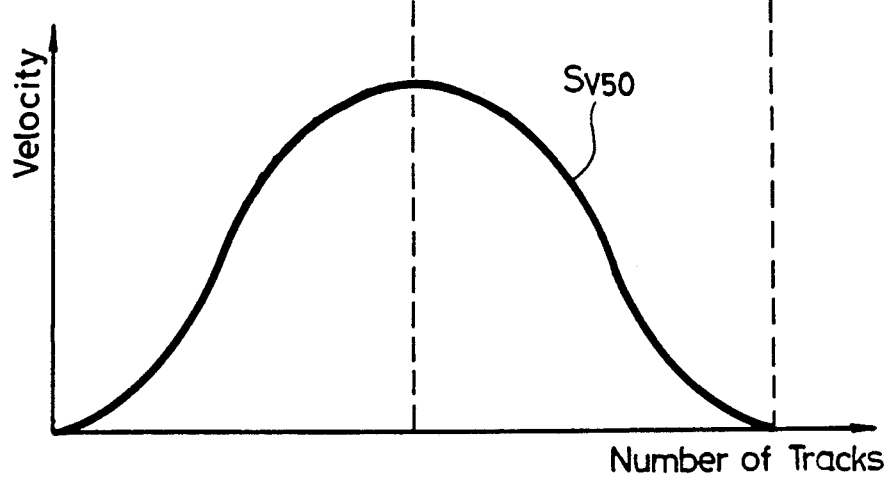

SEEK APPARATUS FOR OPTICAL DISC DRIVE

BACKGROUND OF THE INVENTION

1. Field of the Invention

The present invention relates generally to optical disc drives and more particularly to an optical disc drive suitable for use with optical information processing apparatus such as a magneto-optical disc drive and so on.

2. Description of the Prior Art

FIG. 1 schematically illustrates an arrangement of, for example, a conventional optical disc drive.

Referring to FIG. 1, a conventional optical disc drive mainly comprises a pair of guide rods 3A and 3B, an optical pickup 4 and an objective lens bobbin 6 having an objective lens 7 and rotatable around a rotary shaft 5 provided on the optical pickup 4 at its center. The pair of guide rods 3A and 3B are extended along the radial direction of a magneto-optical disc 1. The optical pickup 4 moves along the pair of guide rods 3A and 3B in the direction shown by an arrow b such that it traverses recording tracks 2 formed on the magneto-optical disc 1 which rotates in the direction shown by an arrow a. The objective lens bobbin 6 rotates around the rotary shaft 5 by a very small amount in the direction shown by an arrow c.

The objective lens 7 is mounted on the objective lens bobbin 6 at the position deviated in the direction perpendicular to the guide rods 3A and 3B from the rotary shaft 5 such that it irradiates a light beam spot on the magneto-optical disc 1. Thus, when the optical pickup 4 moves along the guide rods 3A and 3B in the direction shown by an arrow b, the light beam spot irradiated on the magneto-optical disc 1 from the objective lens 7 moves to cross the recording tracks 2, thus to seek a recording track to be accessed. In other words, a so-called seek operation is performed.

When the light beam spot irradiated from the objective lens 7 reaches the recording track to be accessed, if the objective lens bobbin 6 is controlled (fine-tracking-controlled) to rotate in the direction shown by the arrow c on the basis of a tracking error signal, the objective lens 7 is urged to move in the widthwise direction of the recorded track 2 in the direction shown by the arrow d by a very small amount. Thus, such a tracking-controlling is effected that the light beam spot from the objective lens 7 follows the target recording track 2.

OBJECTS AND SUMMARY OF THE INVENTION

Accordingly, it is an object of the present invention to provide an optical disc drive of a very simplified arrangement in which an optical pickup can perform the seek operation at high speed to reduce a time necessary for accessing a target recording track of an optical disc.

It is another object of the present invention to provide an optical disc drive which can carry out the tracking control just after the optical pickup has finished the seek operation.

According to an aspect of the present invention, there is provided an optical disc drive having a seek control circuit for driving an optical pickup to reach a target recording track, comprising:

a) velocity feedback means for controlling a velocity of said optical pickup by detecting a velocity thereof; and b) seek control means for calculating the number of remaining tracks to said target recording track on the basis of a signal derived from said optical pickup and for supplying a target velocity signal to said velocity feedback means on the basis of the calculated result.

The above, and other objects features and advantages of the present invention will become apparent from the following detailed description of the preferred embodiments to be taken in conjunction with the accompanying drawings, in which like reference numerals identify like elements and parts.

BRIEF DESCRIPTION OF THE DRAWINGS

FIGS. 12A to 12C are respectively illustrations used to explain the operation of the fourth embodiment of the present invention.

DETAILED DESCRIPTION OF THE PREFERRED EMBODIMENTS

The present invention will now be described with reference to the drawings.

Figure 1:
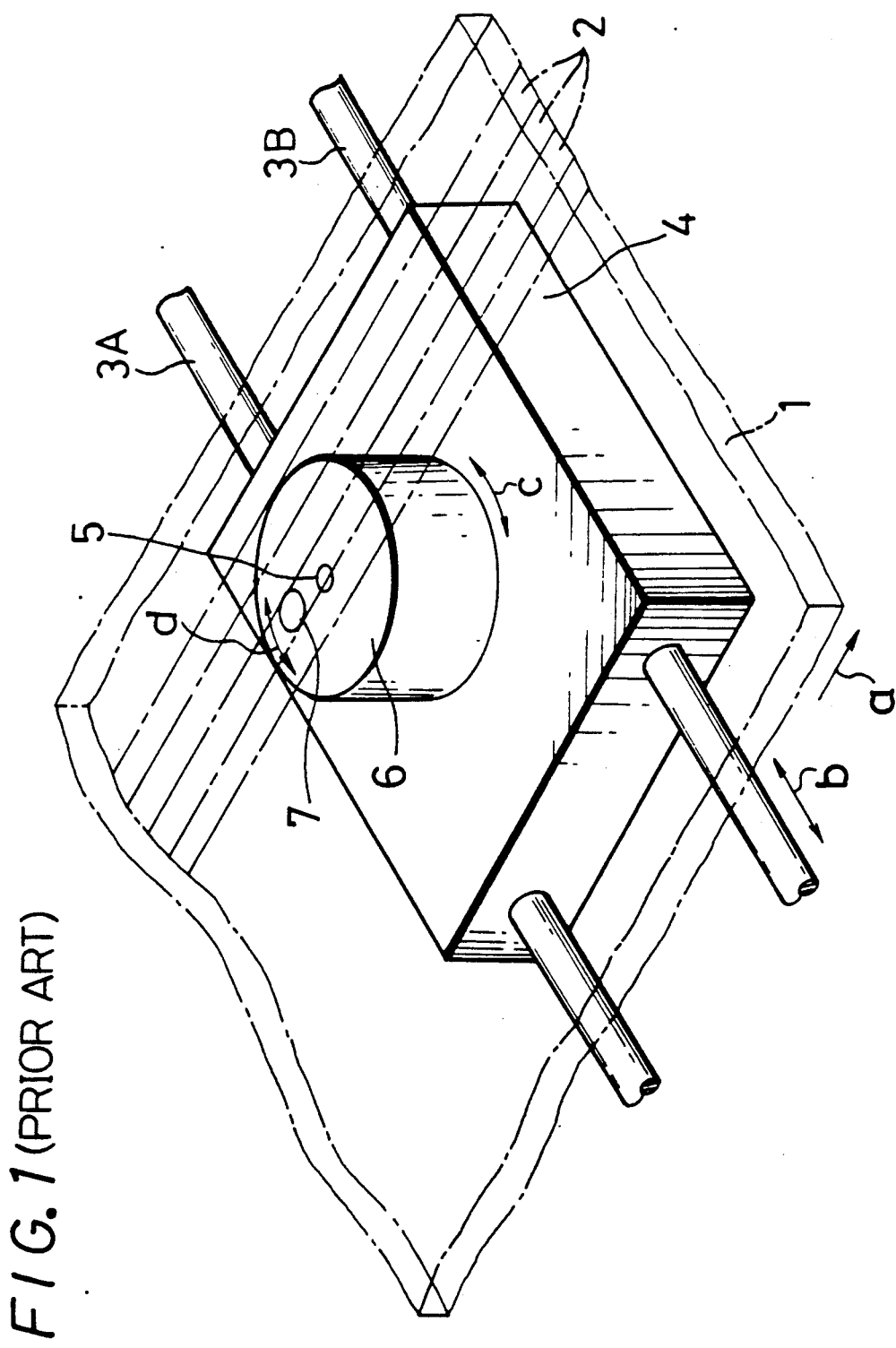
FIG. 1 is a perspective view of a conventional optical disc drive to which the present invention is applied.
Figure 2:
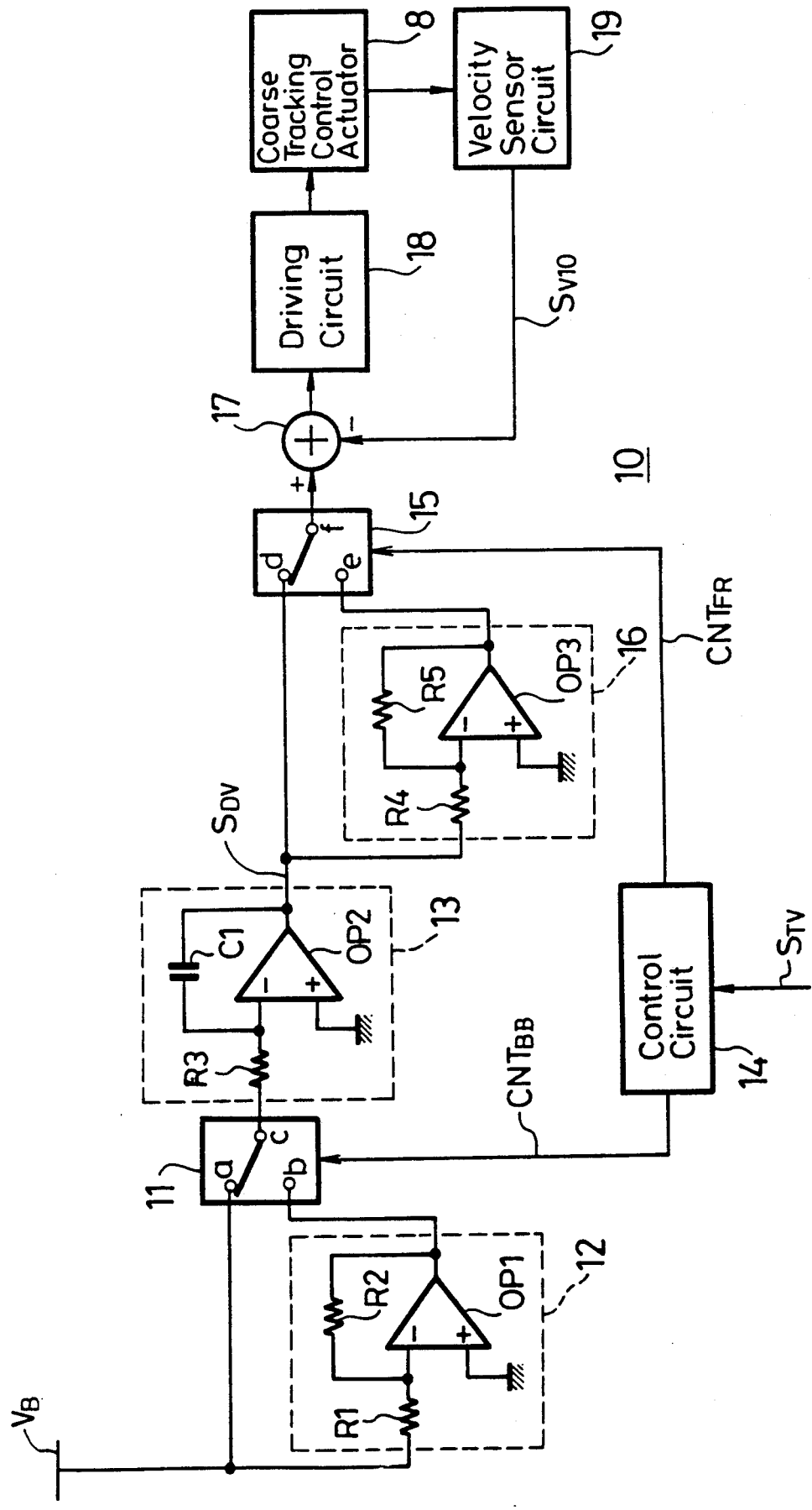
FIG. 2 is a block diagram of a seek control circuit according to the present invention.

To achieve the above-mentioned objects, such a circuit as shown in FIG. 2 is considered as a so-called seek control circuit that controls the movement of the optical pickup 4 (FIG. 1). In this embodiment, the above-mentioned seek control circuit might be a so-called bang-bang control circuit. According to this seek control circuit, when the optical pickup 4 seeks a target recording track from a certain recording track, a predetermined voltage is integrated till the optical pickup 4 seeks the recording tracks the number of which is half the number of the recording tracks to the target recording track from a certain recording track, while a voltage of polarity opposite to that of the predetermined voltage is integrated till the optical pickup 4 seeks the target recording track from the half number of the recording track. Then, the thus integrated outputs are used to drive the optical pickup 4.

FIG. 2 schematically illlustrates an overall arrangement of a seek control circuit 10 which controls a coarse tracking control actuator 8. The coarse tracking control actuator 8 comprises a linear motor or the like to drive the optical pickup 4 (FIG. 1).

In the seek control circuit 10 shown in FIG. 2, a predetermined voltage $V_B$ is supplied to a first fixed contact a of a first switching circuit 11. This predetermined voltage $V_B$ is also supplied to a second fixed contact b of the first switching circuit 11 via an inverting circuit 12 which is formed of first and second resistors R1 and R2 and an operational amplifier OP1.

The first switching circuit 11 connects its movable contact c to the first fixed contact a or second fixed contact b in response to a control signal $CNT_{BB}$ supplied thereto from a control circuit 14. This control circuit 14 might be formed of, for example, a microcomputer.

The control circuit 14 responds to a traverse count signal $S_{TV}$ which is obtained by counting the number of the recording tracks that are traversed by the optical pickup 4 during its seeking operation and it switches the switching circuit 11 to change its position or controls the control signal $CNT_{BB}$ at a timing (time point) at which the optical pickup 4 passes the recording tracks of the number, t/2 which is half of the number, t which is the number of the recording tracks from the recording track at the start of the seeking operation to the target recording track. The traverse count signal $S_{TV}$ results from binary-coding a tracking error signal detected during the seek operation.

Figure 3A:
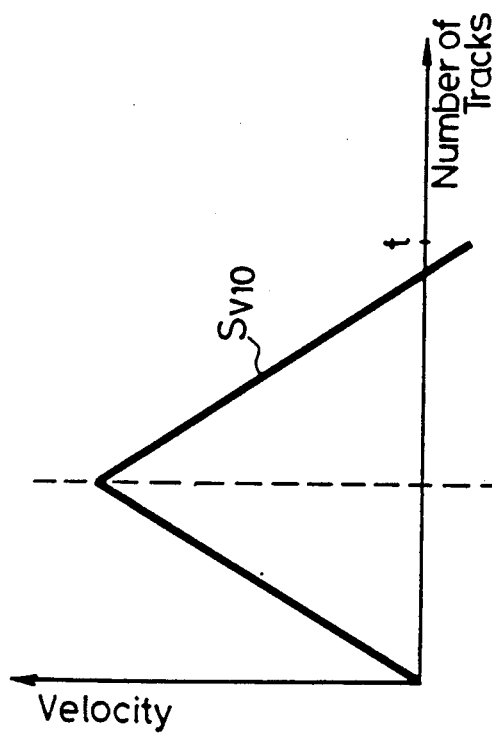
FIGS. 3A to 3D are respectively schematic representations used to explain the operation of the seek control circuit shown in FIG. 2.

Accordingly, the first switching circuit 11 connects its movable contact c to the first fixed contact a till the optical pickup 4 passes the recording tracks of the number, t/2 half the number, t of the recording tracks that the optical pickup 4 traverses up to the target recording track, thereby to allow the predetermined voltage $V_B$ to be fed to a succeeding integrating circuit 13 as shown in FIG. 3A. When the target recording track to be seeked from the recording track reaches the half number t/2, the first switching circuit 11 connects its movable contact c to the second fixed contact b to allow a voltage $-V_B$ of polarity opposite to that of the predetermined voltage $V_B$ to be fed to the integrating circuit 13 as shown in FIG. 3A.

The integrating circuit 13 comprises a resistor R3, a capacitor C1 and an operational amplifier OP2. The integrating circuit 13 integrates the incoming voltages $V_B$ and $-V_B$ to supply an integrated output $S_{DV}$ to a first fixed contact d of a second switching circuit 15. As shown in FIG. 3B, the integrated output $S_{DV}$ linearly increases until the optical pickup 4 passes the recording tracks of the number, t/2 half the number, t of the recording tracks to the target recording track, seeked, while it linearly decreases till the target recorded track from the recording track at the half number t/2. Also, the integrated output $S_{DV}$ is inverted by an inverting circuit 16 and then fed to a second fixed contact e of the second switching circuit 15. The inverting circuit 16 is formed of resistors R4 and R5 and an operational amplifier OP3.

The second switching circuit 15 responds to a control signal $CNT_{FR}$ supplied thereto from the control circuit 14 to connect its movable contact f to the first fixed contact d when the optical pickup 4 seeks the recording tracks from, for example, the inner peripheral recording track to the outer peripheral recording track of the magneto-optical disc 1 (FIG. 1). Conversely, the second switching circuit 15 connects its movable contact f to the second fixed contact e when the optical pickup 4 seeks the recording tracks from the outer peripheral recording track to the inner peripheral recording track of the magneto-optical disc 1.

Thus, the second switching circuit 15 produces at its output terminal or movable contact f the integrated output $S_{DV}$ which changes its polarity in response to the direction in which the optical pickup 4 moves. This integrated output $S_{DV}$ is supplied through an adding circuit 17 to a driving circuit 18 that drives the coarse tracking control actuator 8 to drive the optical pickup 4. The adding circuit 17 might be formed of an operational amplifier.

A velocity sensor circuit 19 which might be a photo-sensor or the like is located near the optical pickup 4 to detect the moving velocity of the optical pickup 4. The velocity sensor circuit 19 produces a velocity detecting signal $S_{V10}$ of the optical pickup 4. This velocity detecting signal $S_{V10}$ is supplied to the adding circuit 17, in which it is subtracted from the integrated output $S_{DV}$, thus forming a velocity servo loop which is, on the whole, a negative feedback circuit with respect to the moving velocity of the optical pickup 4.

Thus, immediately after the optical pickup 4 has finished its seek operation in response to the incoming integrated output $S_{DV}$, the relative velocity between the optical pickup 4 and the target recording track can be made [0].

In the thus arranged seek control circuit 10 for controlling the optical pickup 4, however, due to the vibration of the optical pickup 4 itself, Coulomb friction occurred at the mechanically-sliding portion upon seek operation and so on, the loop gain of the velocity servo loop formed of the driving circuit 18, the coarse tracking control actuator 8 and the velocity sensor circuit 19 cannot be selected to be large so that the stationary velocity offset cannot be removed.

Figure 3C:
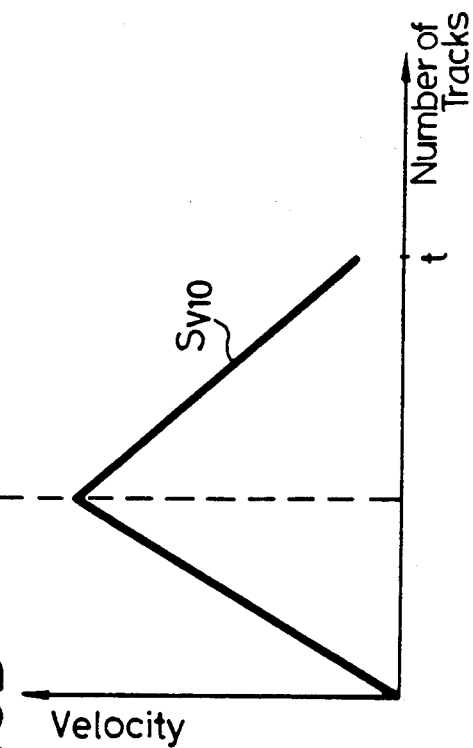
Figure 3B:
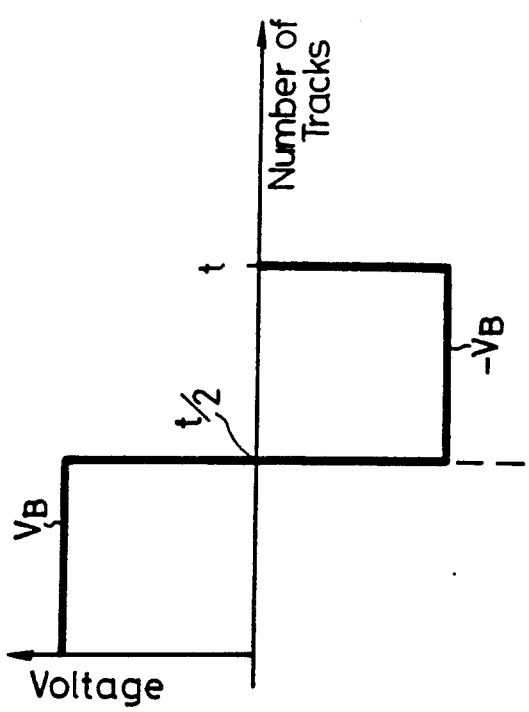
Figure 3D:
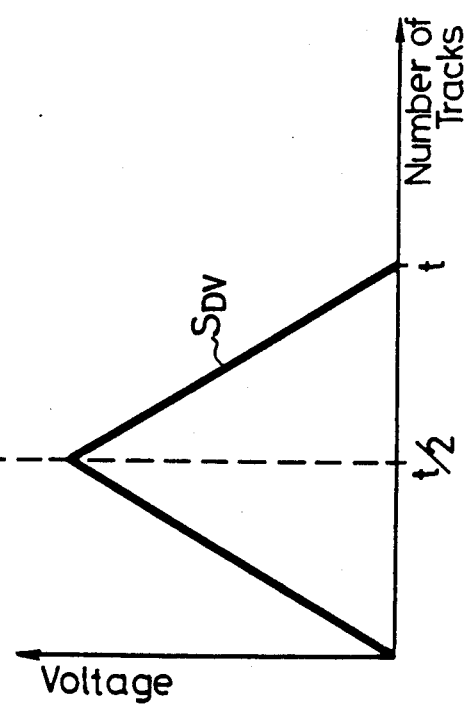

Consequently, as, for example, shown in FIGS. 3C and 3D, the velocity of the optical pickup 4 itself cannot be made [0] at a timing (time point) in which the voltage to be supplied to the driving circuit 18 is turned off when the control circuit 14 detects that the optical pickup 4 reaches the target recording track. As a result, the tracking control cannot be performed immediately after the seek operation is ended, or the tracking pull-in operation cannot be performed immediately.

Now, the practical embodiments of the present invention which are free from the above defect will be described in detail with reference to the drawings.

Figure 4:
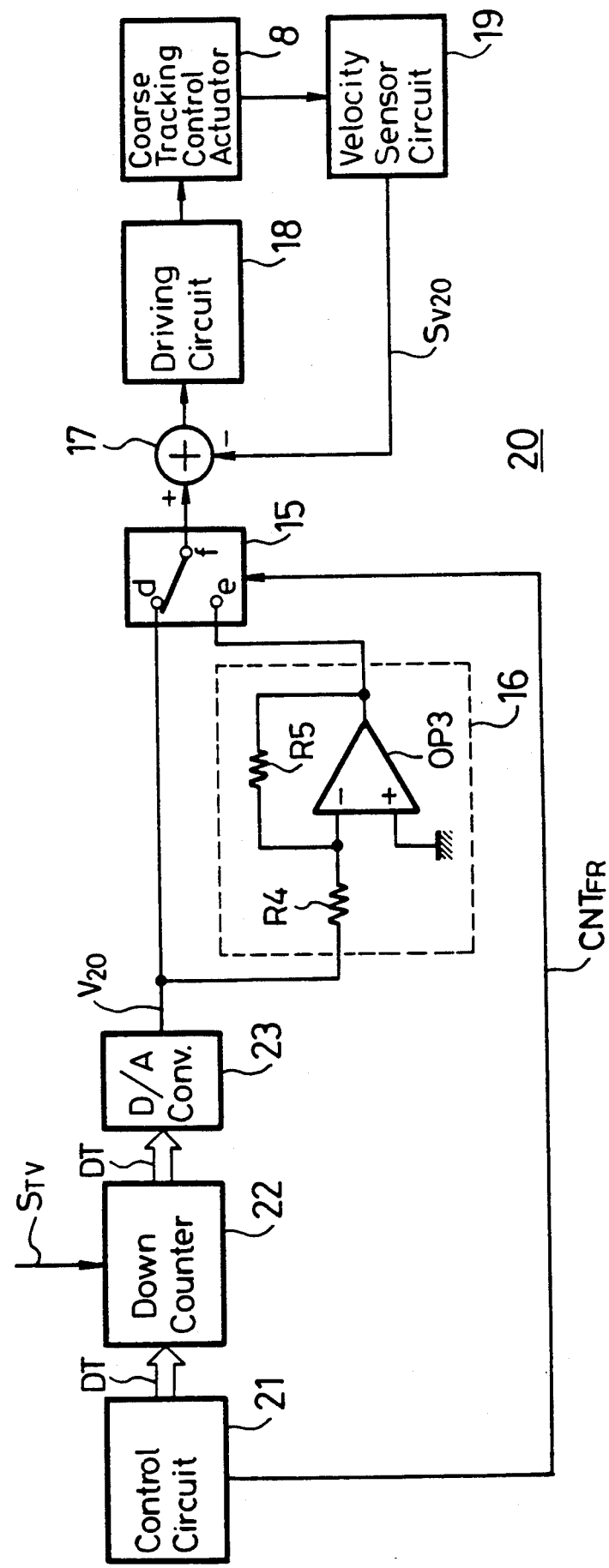
FIG. 4 is a block diagram showing a first practical embodiment of the seek control circuit according to the present invention.

FIG. 4 illustrates a first practical embodiment of a seek control circuit according to the present invention. In FIG. 4, like parts corresponding to those of FIG. 2 are marked with the same references and therefore need not be described in detail.

Referring to FIG. 4, there is shown a seek control circuit 20 of the first embodiment of the present invention. The seek control circuit 20 includes a control circuit 21 which might be formed of, for example, a microcomputer. The control circuit 21 produces data DT indicative of the number of the recording tracks to be seeked up to the target recording track. The data DT is previously set in a down-counter 22. The down-counter 22 comprises, for example, four 4-bit synchronizing down-counters connected in cascade, though not shown. Each of the 4-bit synchronizing down-counters can be initialized in advance. The down-counter 22 sequentially counts down the pre-set track number at timing in which the traverse count signal $S_{TV}$ rises. Each time the down-counter 22 counts down, it supplies a count value CT to a D/A (digital-to-analog) converting circuit 23.

Figure 5A:
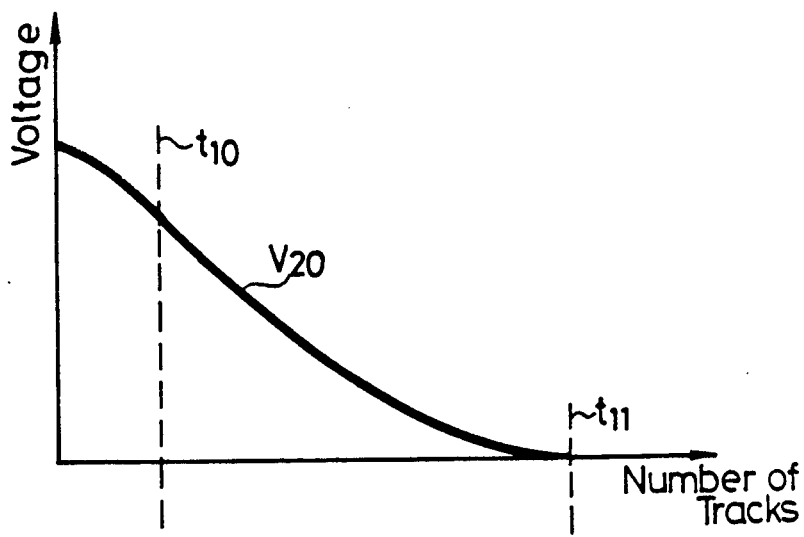
FIGS. 5A and 5B are respectively schematic representations used to explain the operation of the seek control circuit shown in FIG. 4.

Thus, the D/A converting circuit 23 produces a drive voltage $V_{20}$ that corresponds to the number of the recording tracks to be seeked by the optical pickup 4 as shown in FIG. 5A and then supplies this drive voltage $V_{20}$ through the switching circuit 15, the adding circuit 17 and the driving circuit 18 to the coarse tracking control actuator 8, thus forming a location servo loop corresponding to the moving amount of the optical pickup 4 by using the traverse count signal $S_{TV}$.

Figure 5B:
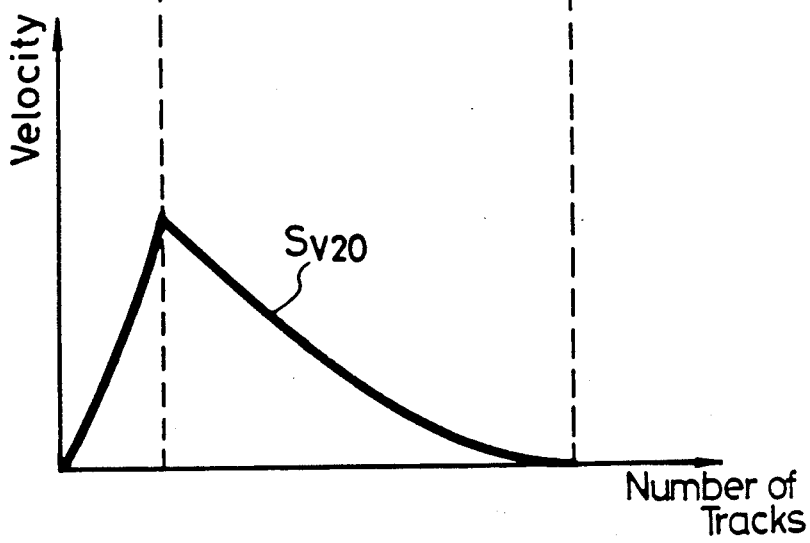

Accordingly, as shown in FIG. 5B, the moving velocity $S_{V20}$ of the optical pickup 4 is increased with a high acceleration on the basis of the velocity signal $S_{V20}$ derived from the velocity sensor circuit 19 until a recording track at a track number $t_{10}$ where the velocity signal $S_{V20}$ is lower than the drive voltage $V_{20}$ supplied from the D/A converting circuit 23.

Meanwhile, until the optical pickup 4 seeks the recording tracks from the recording track at the track number $t_{10}$ to the recording track at a track number $t_{11}$ or to the target recording track, the negative feedback circuit is formed in the velocity servo loop so that, from the recording track at the track number $t_{10}$ to the target recording track, the moving velocity $S_{V20}$ of the optical pickup 4 is decreased to be smoothly converged to [0]. Further, the moving velocity $S_{V20}$ of the optical pickup 4 can be positively reduced to [0] at a timing (time point) in which the optical pickup 4 reaches the target recording track.

With the above-mentioned arrangement, when the optical pickup 4 starts its seek operation, the drive voltage $V_{20}$ corresponding to the number of the tracks to be seeked is supplied to the coarse tracking control actuator 8 of the optical pickup 4 and the drive voltage $V_{20}$ is sequentially decreased in accordance with the movement of the optical pickup 4. Thus, when the optical pickup 4 reaches the target recording track, the moving velocity of the optical pickup 4 can be positively made [0].

Therefore, since the tracking control can be performed immediately after the optical pickup 4 has finished its seek operation, it is possible to realize an optical disc drive of a simplified arrangement which can reduce a time necessary for accessing on the whole.

Figure 6:
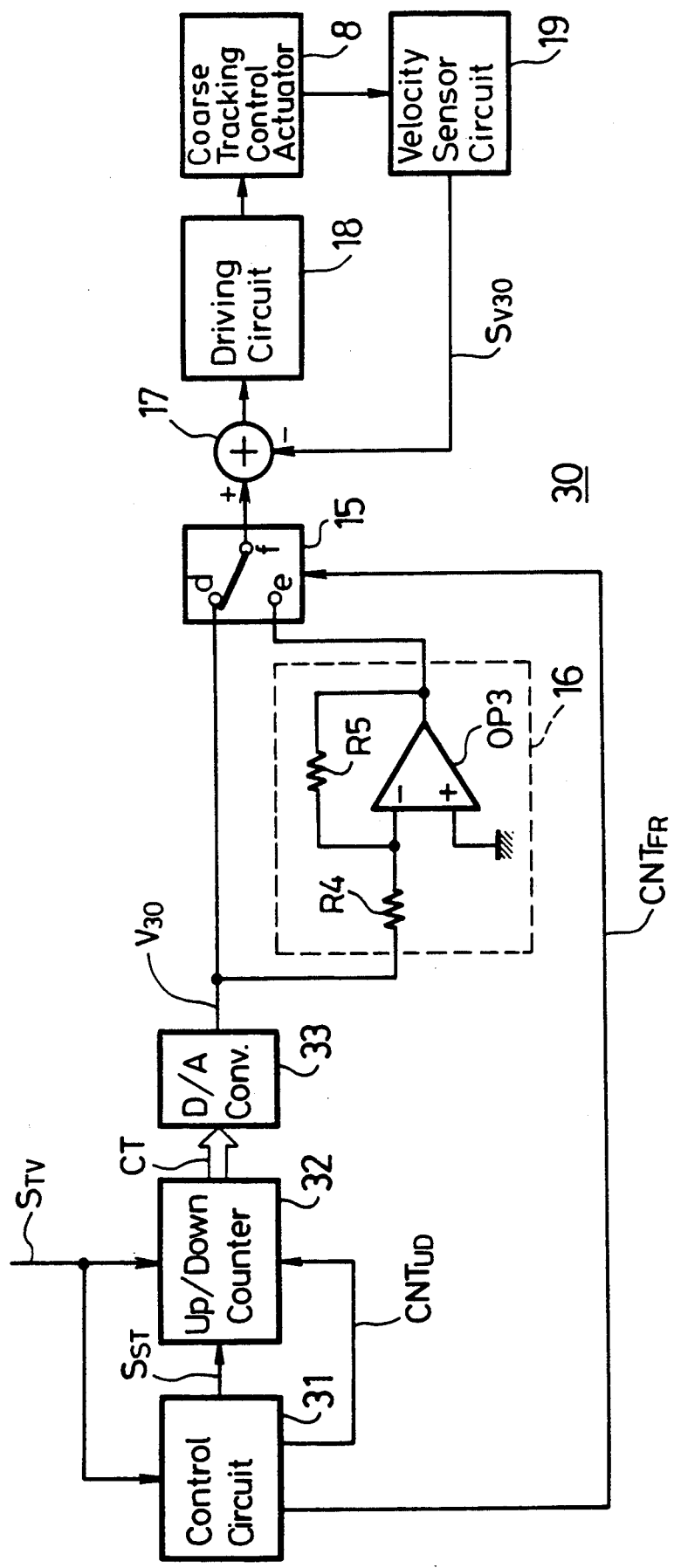
FIG. 6 is a block diagram showing a second practical embodiment of the seek control circuit according to the present invention.

FIG. 6 illustrates a circuit arrangement of the second embodiment of the present invention. In FIG. 6, like parts corresponding to those of FIG. 4 are marked with the same references and therefore need not be described in detail.

Referring to FIG. 6, there is shown a seek control circuit 30 of the second embodiment of the present invention. In this embodiment, the down-counter circuit 22 of FIG. 4 is replaced with an up/down counter 32. The up/down counter 32, under the control of a control circuit 31, carries out the count-up operation until the optical pickup seeks the recording tracks of the track number half of the track number of the recording tracks to be seeked from an initial value [0], while it carries out the count-down operation from the recording track at the half track number to the target recording track.

Specifically, as shown in FIG. 7, the up/down counter circuit 32 starts the count-up operation from the rising-up timings of the start signal $S_{ST}$ and the up/down signal $CNT_{UD}$ from the control circuit 31 at every time the traverse count signal $S_{TV}$ rises up. Then, since the up/down signal $CNT_{UD}$ from the control circuit 31 falls at a timing where the recording tracks of the number half of the number of the recording track tracks to be seeked to the target recording track are counted, the up/down counter circuit 32 starts the count-down operation and supplies the count value CT to a D/A converting circuit 33.

Figure 7A:
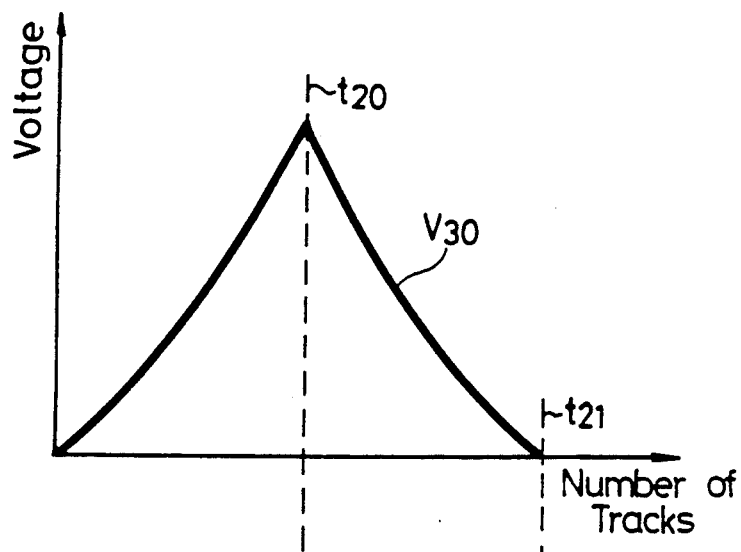
FIGS. 7A to 7C are respectively schematic representations used to explain the operation of the seek control circuit shown in FIG. 6.
Figure 7B:
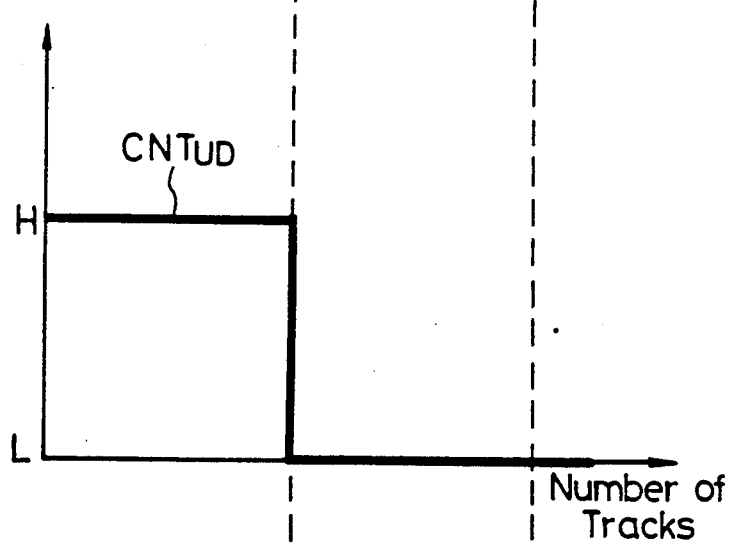

Accordingly, the D/A converting circuit 33 produces a drive voltage $V_{30}$ that increases in accordance with the movement of the optical pickup 4 until the optical pickup 4 moves to the recording track of a track number, $t_{20}$ half a track number, $t_{21}$ of the recording tracks to be seeked to the target track as shown in FIG. 7A. The drive voltage $V_{30}$ is supplied through the switching circuit 15, the adding circuit 17 and the drive circuit 18 to the coarse tracking control actuator 8.

During a period in which the optical pickup 4 moves to the target recording track from the track of the track number $t_{20}$ half of the track number, $t_{21}$ to be seeked, the up/down signal $CNT_{UD}$ (FIG. 7B) derived from the control circuit 31 falls down so that the up/down counter circuit 32 performs the count-down operation. Therefore, the D/A converting circuit 33 produces the drive voltage $V_{30}$ which sequentially decreases as the optical pickup 4 moves as shown in FIG. 7A. This drive voltage $V_{30}$ is supplied through the switching circuit 15, the adding circuit 17 and the drive circuit 18 to the coarse tracking control actuator 8, thus forming a location servo loop based on the moving amount of the optical pickup 4 by using the traverse count signal $S_{TV}$.

Figure 7C:
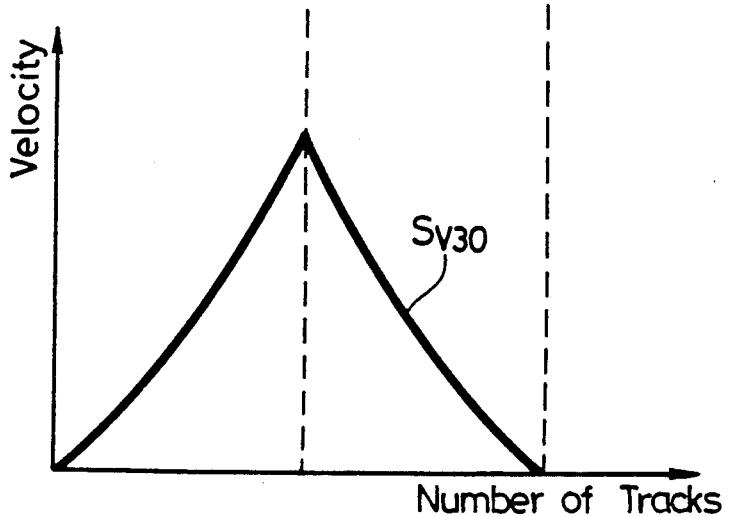

Since the positive feedback circuit is formed in the velocity servo loop until the optical pickup 4 moves to the track of the track number $t_{20}$ half of the track number $t_{21}$ of the recording tracks to be seeked to the target recording track on the basis of the velocity signal $S_{V30}$ derived from the velocity sensor circuit 19, the moving velocity $S_{V30}$ of the optical pickup 4 increases with a large acceleration as shown in FIG. 7C.

Meanwhile, during a period in which the optical pickup 4 moves to the recording track of the track number $t_{21}$ from the recording track of the track number $t_{20}$ which is half of the track number $t_{21}$ of the tracks to be seeked, the negative feedback circuit is formed in the velocity servo loop so that from the recording track of the track number $t_{20}$ to the target recording track of the track number $t_{21}$, the moving velocity $S_{V30}$ of the optical pickup 4 is smoothly converged to [0]. Further, the moving velocity $S_{V30}$ of the optical pickup 4 can be positively made [0] at a timing (time point) when the optical pickup 4 reaches the target recording track.

According to the above-mentioned arrangement, the coarse tracking control actuator 8 is driven by the drive voltage $V_{30}$ which sequentially increases during the period in which the optical pickup 4 moves to the recording tracks of the track number, $t_{20}$ half of the track number, $t_{21}$ of the recording tracks to be seeked to the target track to be seeked from the start of the seek operation and which sequentially decreases during a period in which the optical pickup 4 moves from the recording track of the track number, $t_{20}$ to the target recording track. Thus, when the optical pickup 4 moves to the recording track of the track number $t_{21}$ or the target track, the moving velocity $S_{V30}$ of the optical pickup 4 can be positively made [0].

Therefore, since the tracking control can be executed immediately after the optical pickup 4 has finished its seek operation, it is possible to realize the optical disc drive of simplified arrangement which can reduce the entire accessing time.

Furthermore, according to the above-mentioned second embodiment, since as compared with the first embodiment the up/down counter 32 need not be initialized and the count value of the up/down counter 32 is half of that of the down counter 22, the seek control circuit of the second embodiment can be realized by using the counter circuit of considerably simplified circuit arrangement.

Figure 8:
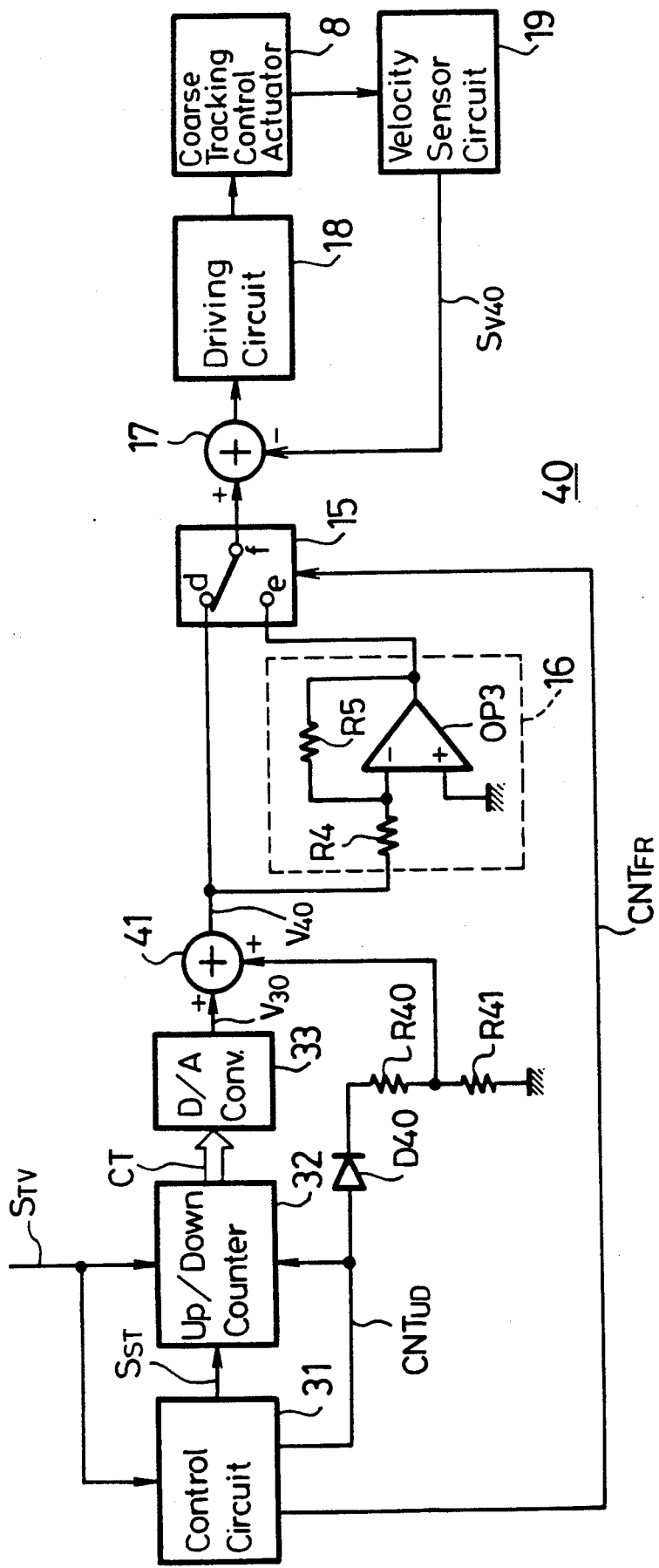
FIG. 8 is a block diagram showing a third practical embodiment of the seek control circuit according to the present invention.

FIG. 8 illustrates the third embodiment of the seek control circuit according to the present invention. In FIG. 8, like parts corresponding to those of FIG. 6 are marked with the same references and therefore need not be described in detail.

As FIG. 8 shows, there is shown a seek control circuit 40 of the third embodiment of the present invention. In this embodiment, the seek control circuit 30 of FIG. 6 is modified as follows. In the seek control circuit 40 shown in FIG. 8, during a period in which the optical pickup 4 moves to the recording track of the track number $t_{30}$ half of the track number $t_{31}$ of the recording tracks to be seeked to the target recording track, the drive voltage $V_{30}$ to be supplied to the coarse tracking control actuator 8 is supplied to an adding circuit 41, in which it is added with the voltage which results from dividing the leading edge portion of the up/down count signal $CNT_{UD}$ by resistors R40 and R41 through a diode D40.

Figure 9A:
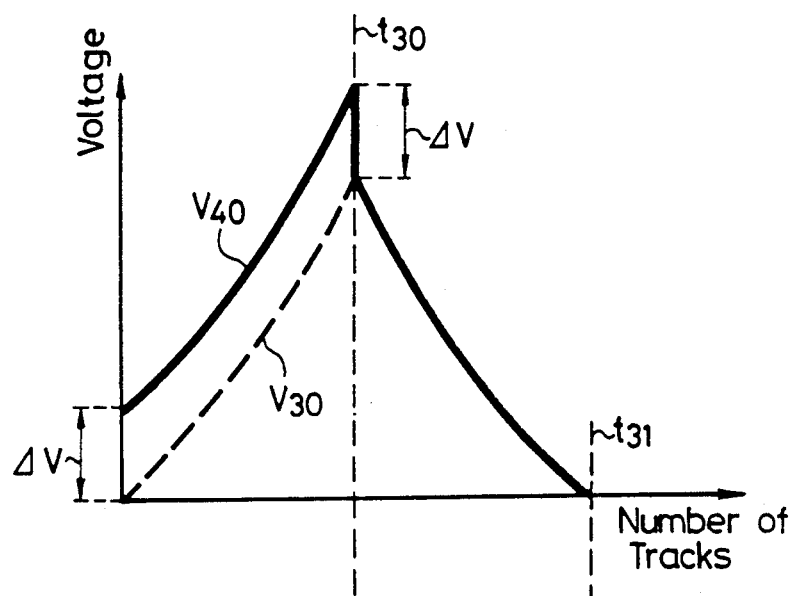
FIGS. 9A to 9C are respectively schematic representations used to explain the operation of the seek control circuit shown in FIG. 8.
Figure 9B:
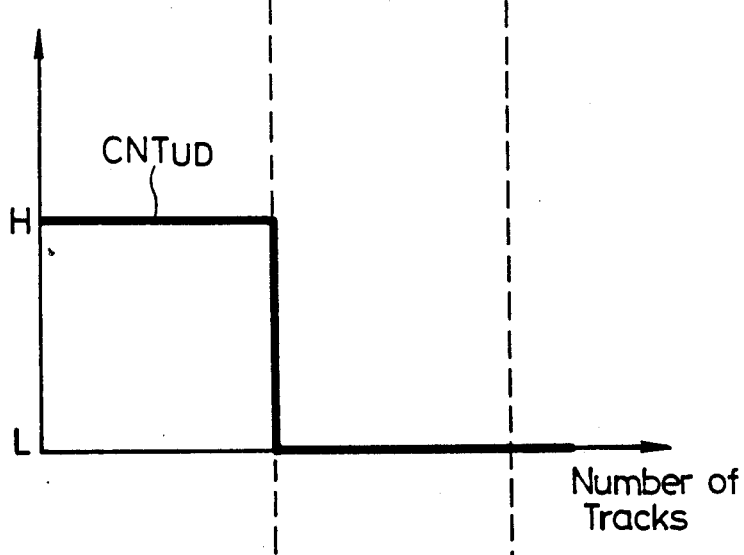

The adding circuit 41 therefore produces a drive voltage $V_{40}$ which is higher than the drive voltage $V_{30}$ (shown by a broken line in FIG. 9A) of the second embodiment by an amount of an emphasis voltage $\Delta V$ which results from dividing the leading edge portion of the up/down signal $CNT_{UD}$ (FIG. 9B) during a period in which the optical pickup 4 moves to the recording track of the number $t_{30}$ half of the number $t_{31}$ of the tracks to be seeked to the target recording track as shown in FIG. 9A. This drive voltage $V_{40}$ is supplied through the switching circuit 15, the adding circuit 17 and the drive circuit 18 to the coarse tracking control actuator 8.

Figure 9C:
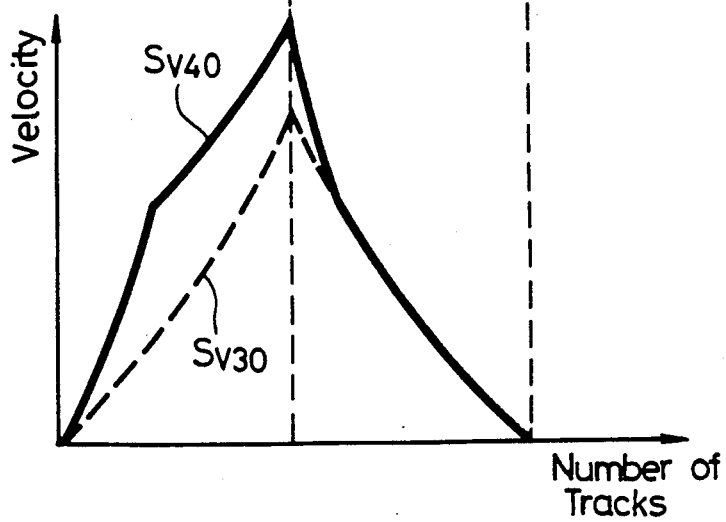

Thus, as compared with the moving velocity $S_{V30}$ (shown by a broken line in FIG. 9C) of the second embodiment, as shown in FIG. 9C, the moving velocity $S_{V40}$ of the optical pickup 4 rapidly increases during a period in which the optical pickup 4 moves to the track of the number $t_{30}$ half of the number $t_{31}$ of the tracks to be seeked to the target recording track. Subsequently, during a period in which the optical pickup 4 moves therefrom to the the target recording track, the moving velocity $S_{V40}$ of the optical pickup 4 is gradually converged to [0] similarly to the second embodiment in response to the number of the remaining tracks to the target recording track. Further, the moving velocity of the optical pickup 4 can be positively controlled to become [0] at a timing (time point) in which the optical pickup 4 reaches the target recording track.

According to the above-mentioned arrangement, since in addition to the arrangement of the second embodiment the drive voltage $V_{40}$ of the coarse tracking control actuator 8 is increased by the amount of the predetermined emphasis voltage $\Delta V$ during the period in which the optical pickup 4 moves to the track of the track number $t_{30}$ half of the track number $t_{31}$ of the tracks to be seeked to the target track from the start of the seek operation, a velocity error of the optical pickup 4 caused at the time when it starts the seek operation can be removed effectively and the starting time of the optical pickup 4 can be considerably reduced.

Thus, it is possible to realize an optical disc drive which can reduce the entire accessing time considerably.

The fourth embodiment of the present invention will be described hereinafter.

Figure 10:
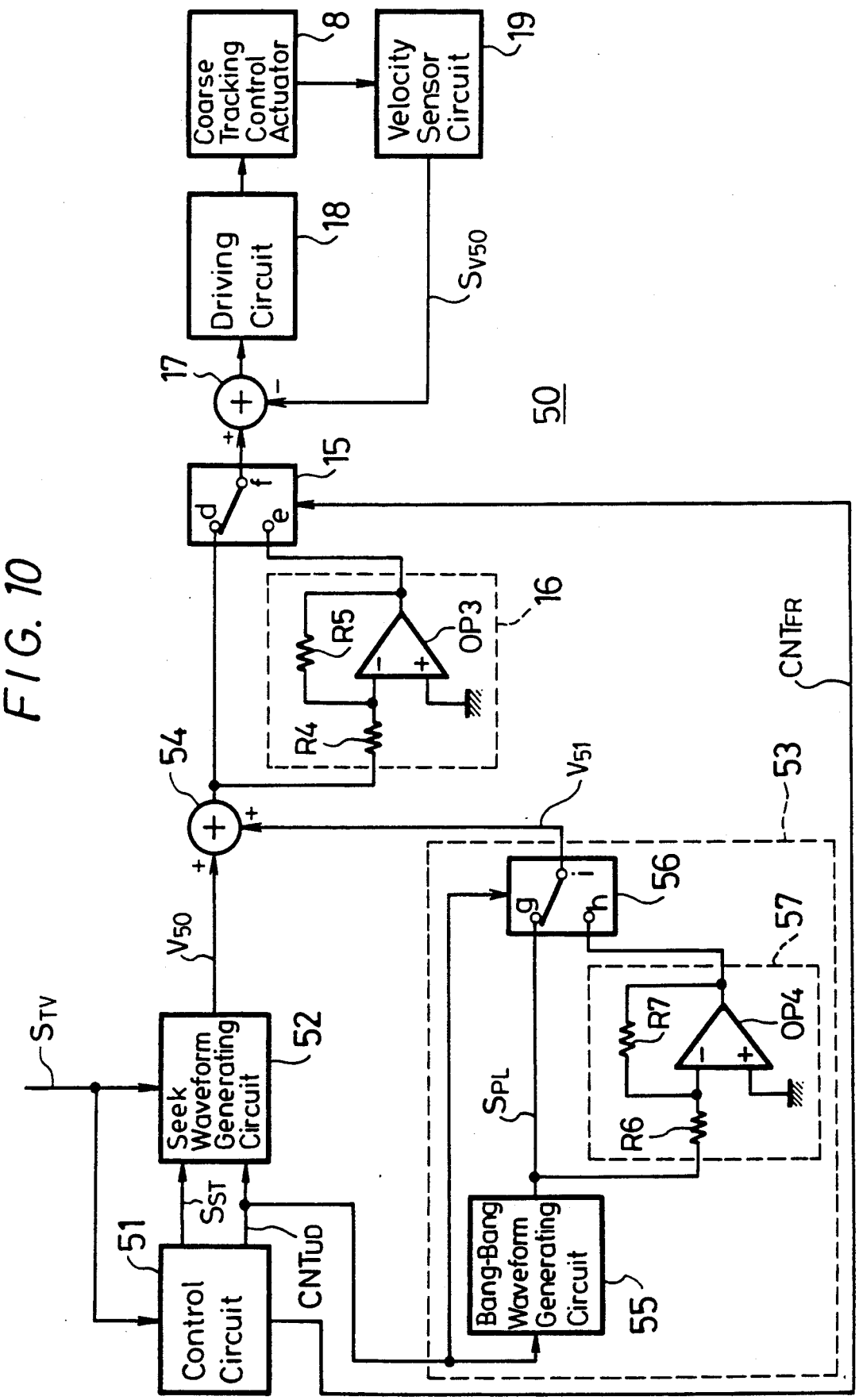
FIG. 10 is a block diagram showing a fourth practical embodiment of the seek control circuit according to the present invention.

FIG. 10 illustrates a circuit arrangement of a seek control circuit 50 of the present invention. In FIG. 10, like parts corresponding to those of FIG. 8 are marked with the same references and therefore need not be described in detail.

Referring to FIG. 10, there is shown the seek control circuit 50. In the seek control circuit 50, mainly a seek waveform generating circuit 52 produces a drive voltage $V_{50}$ which is to be fed to the coarse tracking control actuator 8. Particularly, when there are a few tracks to be seeked, the coarse tracking control actuator 8 is controlled by a drive voltage $V_{51}$ derived from a bang-bang control circuit 53.

Figure 11:
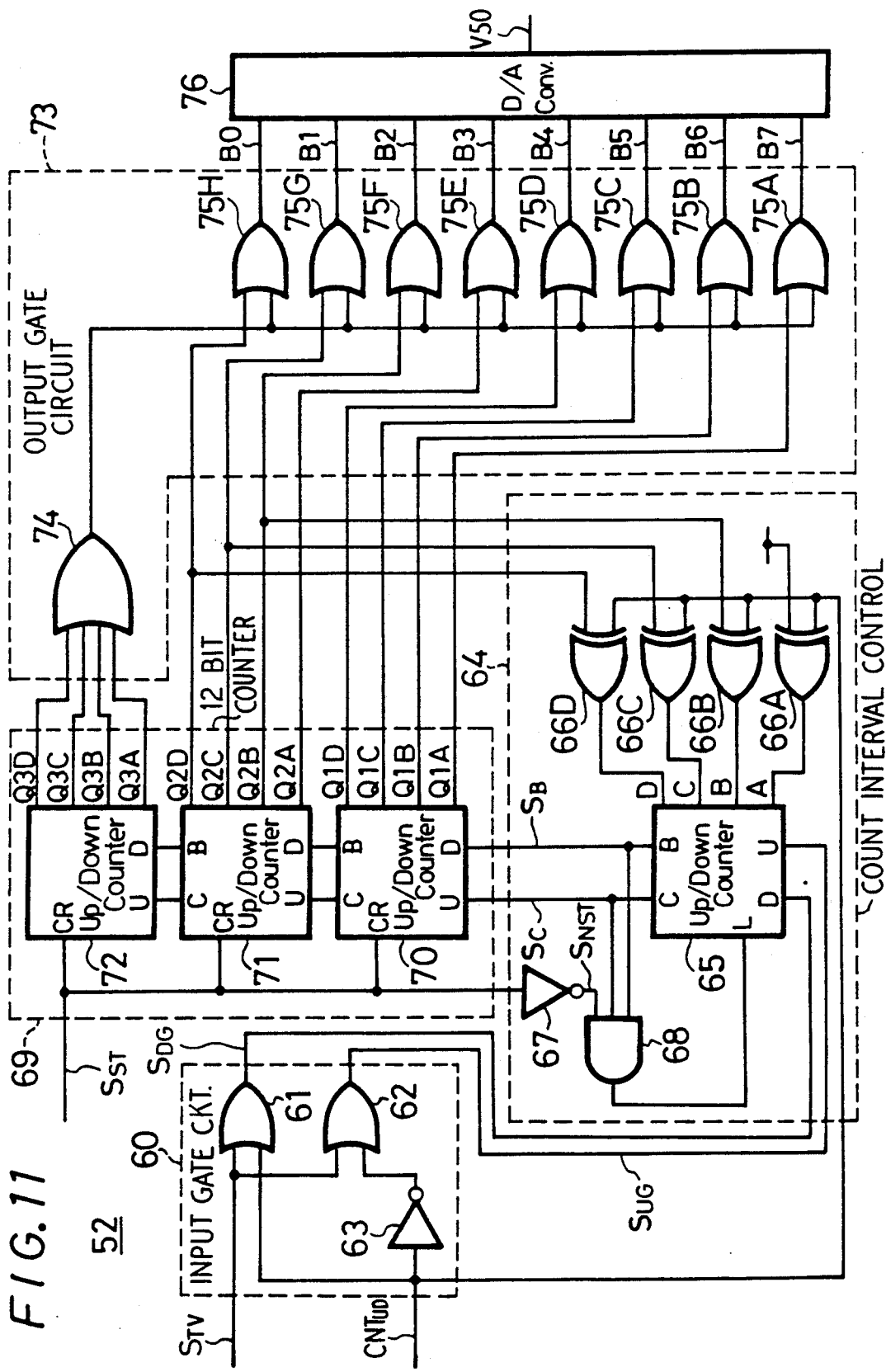
FIG. 11 is a block diagram of a seek waveform generating circuit used in the embodiment shown in FIG. 10.

The seek waveform generating circuit 52 will be described with reference to FIG. 11. As FIG. 11 shows, the seek waveform generating circuit 52 comprises an input gate circuit 60, a count interval control circuit 64, a counter circuit 69, an output gate circuit 73 and a D/A converting circuit 76.

The input gate circuit 60 comprises first and second OR circuits 61 and 62, each of which receives the traverse count signal $S_{TV}$ and also the up/down signal $CNT_{UD}$ directly and through an inverter circuit 63. A down gate signal $S_{DG}$ of logic level [H] when the up/down signal $CNT_{UD}$ is at logic [H] level indicating the count-up operation, is supplied from the first OR circuit 61 to the succeeding count interval control circuit 64. Also, an up-gate signal $S_{UG}$ synchronized with the traverse count signal $S_{TV}$ is supplied from the second OR circuit 62 to the count interval control circuit 64.

When the up/down signal $CNT_{UD}$ is at logic [L] level indicating the count-down operation, the down gate signal $S_{DG}$ synchronized with the traverse count signal $S_{TV}$ is supplied from the first OR circuit 61 to the count interval control circuit 64. The up-gate signal $S_{UG}$ of logic [H] level is supplied from the second OR circuit 62 to the count interval control circuit 64.

The count interval control circuit 64 includes a 4-bit up/down counter 65 having a carry terminal C and a borrow terminal B. The up/down counter 65 also has a load terminal L by which a count value can be set. The up/down counter 65 receives at its four input terminals A, B, C and D 4-bit data derived from a first exclusive-OR circuit 66A, which is supplied with the up/down signal $CNT_{UD}$ and the signal of logic [H] level and from second, third and fourth exclusive-OR circuits 66B, 66C and 66D which are respectively supplied with the up/down signal $CNT_{UD}$ and output Q2B, output Q2C and output Q2D from the more significant 3rd bit, 2nd bit and 1st bit of outputs Q1A, Q1B, Q1C, Q1D, Q2A, Q2B, Q2C and Q2D which are the less significant 8 bits of the counter circuit 69.

In addition to the above-mentioned input data, the up/down counter 65 receives at its load terminal L through an AND circuit 68 a carry signal $S_C$ which falls to logic [L] level only at a timing when the carry occurs, a borrow signal $S_B$ which falls to level [L] only at a timing when the borrow occurs and an inversion start signal $S_{NST}$ which results from inverting by an inverter circuit 67 the start signal $S_{ST}$ rising-up when the seek operation begins.

Since as described above the up/down counter 65 is arranged to set in its inside 4-bit data supplied at the input terminals thereof A, B, C and D at a timing in which the data at the load terminal L falls to logic [L] level, upon starting the seek operation, the 4-bit data derived from the 1st, 2nd, 3rd and 4th exclusive-OR circuits 66A, 66B, 66C and 66D are set in its inside at a timing when the carry and borrow occur. With the above-mentioned data utilized as an initial value, when the traverse count signal $S_{TV}$ is supplied thereto by the up-gate signal $S_{UG}$, the up/down counter 65 counts up, while when the traverse count signal $S_{TV}$ is supplied thereto by the down-gate signal $S_{DG}$, the up/down counter 65 counts down.

In this embodiment, the counter circuit 69 has a 12-bit counter configuration in which 1st, 2nd and 3rd 4-bit up/down counters 70, 71 and 72 are connected in cascade. This counter circuit 69 counts up in response to the carry signal $S_C$ from the count interval control circuit 64 and counts down in response to the borrow signal $S_B$.

In the up/down counter 65, initial values [1110] are respectively set in its input terminals D, C, B and A in this order during a period in which the first and second up/down counters 70 and 71 in the counter circuit 69 produce predetermined 8-bit data [00100000] which result from arranging the outputs therefrom in the order of Q2D, Q2C, Q2B, Q2A and Q1D, Q1C, Q1B, Q1A after, for example, the seek operation is started. Thus, the up/down counter 65 supplies to the counter circuit 69 the carry signal $S_C$ which goes to low level [L] each time the traverse count signal $S_{TV}$ rises twice. Further, during a period in which the first and second up/down counters 70 and 71 in the counter circuit 69 produce predetermined 8-bit data [01000000], data [1100] are respectively set in its input terminals D, C, B and A, whereby the up/down counter 65 supplies to the counter circuit 69 the carry signal $S_C$ which goes to low level [L] each time the traverse count signal $S_{TV}$ rises 4 times. As described above, the count interval control circuit 64 supplies to the counter circuit 69 the carry signal $S_C$ which goes to low level [L] each time the traverse count signal $S_{TV}$ rises 6 times, 8 times, 10 times, 12 times, 14 times and 16 times as the less significant 8-bit data produced from the counter circuit 69 increases by a predetermined amount.

Conversely, when the up/down counter 65 counts down, the count interval control circuit 64 supplies to the counter circuit 69 the borrow signal $S_B$ which goes to low level [L] each time the traverse count signal $S_{TV}$ rises 15 times, 13 times, 11 times, 9 times, 7 times, 5 times, 3 times and 1 time as the 8-bit data from the counter 69 decreases sequentially.

Further, 4-bit data Q3A, Q3B, Q3C and Q3D from the third up/down counter 72 in the counter circuit 69 are inputted through a first OR circuit 74 to one input terminals of 2nd, 3rd, 4th, 5th, 6th, 7th, 8th and 9th OR circuits 75A, 75B, 75C, 75D, 75E, 75F, 75G and 75H in the output gate circuit 73. The 9th to 2nd OR circuits 75H, 75G, 75F, 75E, 75D, 75C, 75B and 75A receive at the other input terminals thereof respective bits of 8-bit data Q2D, Q2C, Q2B, Q2A and Q1D, Q1C, Q1B, Q1A derived from the second and first up/down counters 71 and 70 in the counter circuit 69.

Thus, during the period in which the count value of the counter circuit 69 lies in a range from [0000 0000 0000] to [0001 0000 0000] in the sequential order of the outputs Q3D, Q3C, Q3B, Q3A; Q2D, Q2C, Q2B, Q2A; and Q1D, Q1C, Q1B, Q1A derived from the up/down counters 72, 71 and 70, the 8-bit data Q2D, Q2C, Q2B, Q2A and Q1D, Q1C, Q1B, Q1A from the second and first up/down counters 71 and 70 are supplied to the succeeding D/A converting circuit 76 from 8-bit output terminals B0, B1, B2, B3, B4, B5, B6 and B7 of the output gate circuit 73.

Meanwhile, during the period in which the count value of the counter circuit 69 is larger than [0001 0000 0000] similarly as described above, the output from the first OR circuit 74 in the output gate circuit 73 goes to logic [H] level so that the maximum count value [1111 1111] are supplied to the next digital-to-analog converting circuit 76 from the 8-bit output terminals B0, B1, B2, B3, B4, B5, B6 and B7 of the output gate circuit 73.

Consequently, as the whole of the seek waveform generating circuit 52 shown in FIG. 10, it produces the first drive voltage $V_{50}$ which, as shown in FIG. 12A, rises like a straight line with an inclination decreasing gradually in accordance with the movement of the optical pickup 4 with the starting of seek operation as a reference during the period in which the up/down signal $CNT_{UD}$ (FIG. 12B) is at logic [H] level and which falls like a straight line with an inclination gradually increasing in accordance with the movement of the optical pickup 4 till the target recording track to be seeked during the period in which the up/down signal $CNT_{UD}$ is at logic [L] level. This first drive voltage $V_{50}$ is supplied through an adding circuit 54, the switching circuit 15, the adding circuit 17 and the drive circuit 18 to the coarse tracking control actuator 8.

Therefore, since as compared with the second and third embodiments, the inclination of the first drive voltage $V_{50}$ becomes maximum upon the starting and ending of the seek operation by the optical pickup 4 and hence the loop gain of the velocity servo loop becomes maximum, as shown in FIG. 12C, the moving velocity $S_{V50}$ of the optical pickup 4 is controlled to become [0] on the target recording track more positively.

Besides, in the case of this embodiment shown in FIG. 10, the first drive voltage $V_{50}$ derived from the seek waveform generating circuit 52 is added with a second drive voltage $V_{51}$ derived from the bang-bang control circuit 53 by the adding circuit 54.

In the bang-bang control circuit 53, the up/down signal $CNT_{UD}$ inputted thereto from the control circuit 51 is received by a bang-bang waveform generating circuit 55 of bi-directional monostable multivibrator configuration and by a control terminal of a switching circuit 56.

Thus, the bang-bang waveform generating circuit 55 generates a pulse signal $S_{PL}$ of a predetermined pulse width at the leading and trailing edges of the up/down signal $CNT_{UD}$ The pulse signal $S_{PL}$ is supplied to a first fixed contact g of the switching circuit 56. Also, this pulse signal $S_{PL}$ is supplied to a second fixed contact h of the switching circuit 56 through an inverting circuit 57 which comprises resistors R6, R7 and an operational amplifier OP4.

Figure 13A:
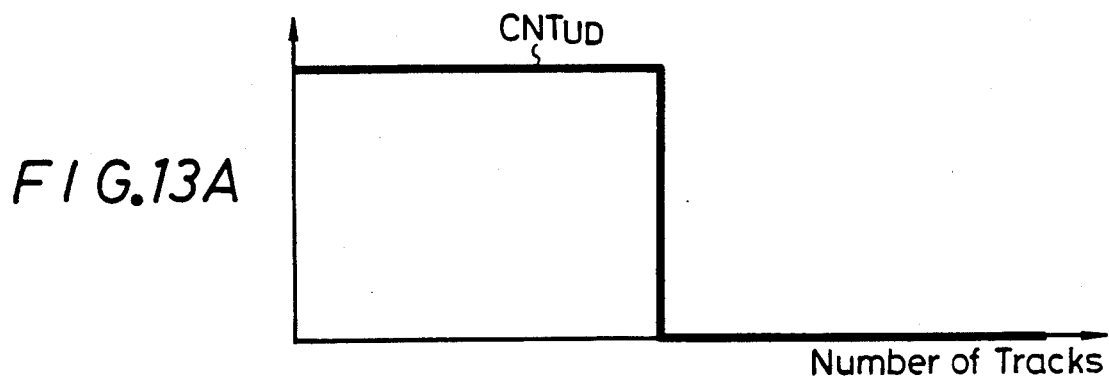
FIGS. 13A to 13D are respectively illustrations used to explain the operation of a bang-bang control circuit of the present invention.
Figure 13B:
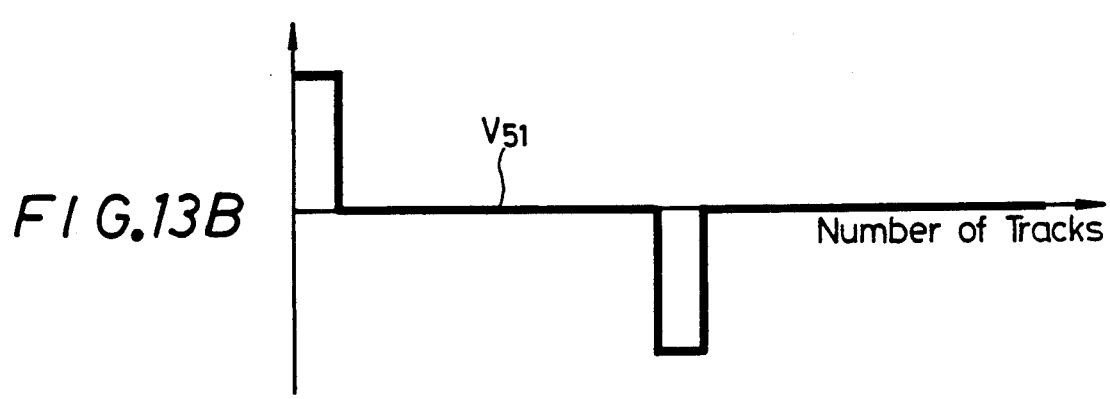

Since the switching circuit 56 connects its movable contact i to the first fixed contact g during the period in which the up/down signal $CNT_{UD}$ applied to the control terminal of the switching circuit 56 is at logic [H] level. On the other hand, the switching circuit 56 connects its movable contact i to the second fixed contact h during the period in which the up/down signal $CNT_{UD}$ is at logic level [L]. Thus, the bang-bang control circuit 53 supplies to the adding circuit 54 the second drive voltage $V_{51}$ which rises with a predetermined pulse width in the positive direction at a timing where the up/down signal $CNT_{UD}$ rises and which falls with a predetermined pulse width in the negative direction at a timing in which the up/down signal $CNT_{UD}$ falls, as shown in FIG. 13B.

Figure 13C:
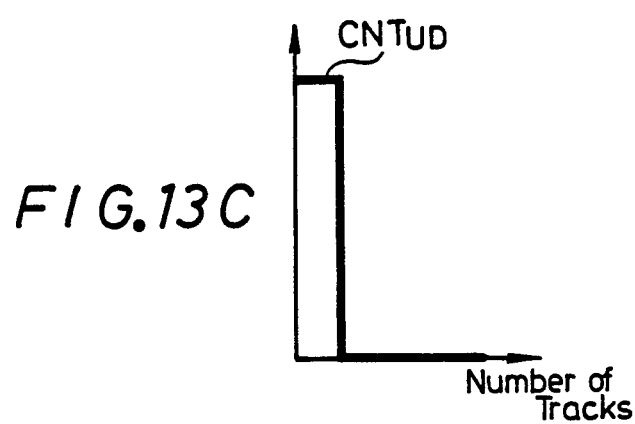
Figure 13D:
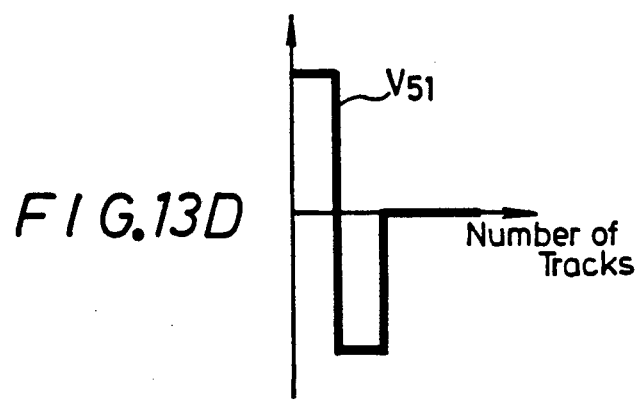

The widths of the pulses rising up and falling down in the second drive voltage $V_{51}$ are selected by the time constant of the bi-directional multivibrator in the bang-bang waveform generating circuit 55 in such a manner that when the seek operation of the coarse tracking control actuator 8, i.e., optical pickup 4 can be controlled on the basis of the first drive voltage $V_{50}$, the pulses do not substantially influence the first drive voltage $V_{50}$. On the other hand, if there are a few tracks to be seeked so that the seek operation of the coarse tracking control actuator 8, i.e., optical pickup 4 cannot be controlled by the first drive voltage $V_{50}$, the bang-bang control circuit 53 performs a so-called bang-bang control by using the second drive voltage $V_{51}$ (FIG. 10D) generated on the basis of the up/down signal $CNT_{UD}$ which changes its level as shown in FIG. 13C.

According to the experiments, if the seek operation of the optical pickup 4 would be controlled only by the use of the 1st, 2nd and 3rd embodiments and the first drive voltage $V_{50}$ derived from the seek waveform generating circuit 52, when the track number to be seeked is less than 64, the seek control could hardly be carried out. Meanwhile, according to the above-mentioned arrangement using the bang-bang control circuit 53, even when the track number to be seeked is about 16, the seek control operation could be executed excellently.

According to the above-mentioned arrangement, the coarse tracking control actuator 8 is controlled in its actuation by using the first drive voltage $V_{50}$ which increases along a straight line with an inclination gradually decreasing as the optical pickup 4 moves during an interval where the optical pickup 4 moves to the recording tracks of the number half of the track number of the target track to be seeked after the seek operation is started and which decreases along a straight line with an inclination gradually increasing as the optical pickup 4 moves during an interval where the optical pickup 4 moves from the recording track at the number half of the track number of the tracks to the target track. Thus, when the optical pickup 4 moves on the target recording track to be seeked, the moving velocity of the optical pickup 4 can be made [0], positively.

Further, according to the above-mentioned arrangement, when there are a very few tracks to be seeked by the optical pickup 4, the second drive voltage $V_{51}$ is generated by using the bang-bang control circuit 53. Thus, even when there are a very few tracks to be seeked, it is possible to positively control the seek operation of the optical pickup 4 by the simplified arrangement.

Consequently, since the tracking control can be executed immediately after the optical pickup 4 has finished the seek operation, it is possible to realize an optical disc drive of a simplified arrangement which can considerably reduce a time necessary for accessing on the whole.

Further, according to the above-mentioned arrangement, since the count value inputted to the D/A converting circuit 76 is obtained in the data form of 8 bits by the counter circuit 69 having the non-linear characteristic, the seek control circuit can be realized by the D/A converting circuit 76 of considerably simplified arrangement as compared with those of the 1st, 2nd and 3rd embodiments of the invention.

While in the above-mentioned 1st, 2nd, 3rd and 4th embodiments of the invention the drive voltage with the desired waveform is generated by the counter circuit or seek waveform generating circuit on the basis of the control of the control circuit, the present invention is not limited to the above-mentioned circuit but data with the desired waveform can be generated by using a predetermined processing program provided, for example, within the control circuit with similar effects to those of the above-mentioned 1st, 2nd, 3rd and 4th embodiments being achieved.

While in the above-mentioned 1st, 2nd, 3rd and 4th embodiments the present invention is applied to the seek control circuit which controls the seek operation of the optical pickup, the present invention is not limited to the above-mentioned seek control circuit but it may be applied to a seek control circuit which controls an objective lens bobbin.

While in the above-mentioned 3rd embodiment the up/down signal is divided through the forward-biasing diode and voltage-dividing resistors and the divided voltage is added to the drive voltage only when the moving velocity of the optical pickup is accelerated, such a variant is also possible that a predetermined voltage is added to the drive voltage through a switching circuit or the like only during a predetermined period.

While in the above-mentioned 4th embodiment the bang-bang waveform generating circuit is formed of the bi-directional monostable multivibrator, according to the present invention, the bang-bang waveform generating circuit may be formed of, for example, a D-type flip-flop or the like. In short, if a pulse of a predetermined pulse width is generated at the leading and trailing edges of the up/down signal, it is possible to achieve the similar effects to those of the above-mentioned 4th embodiment.

While in the above-mentioned 4th embodiment the first and second drive voltages are added to each other at the adding circuit and the resultant voltage is used to control the coarse tracking control actuator, the first and second drive voltages may be switched by, for example, the control circuit or the like on the basis of the number of tracks to be seeked.

While in the above-mentioned embodiments the present invention is applied to the magneto-optical disc drive, the present invention is not limited to the magneto-optical disc drive but it can be applied to a wide variety of optical disc drives such as a read-only memory apparatus (so-called CD ROM) using a compact disc and an information recording and reproducing apparatus using an optical disc or the like.

According to the present invention, as set forth above, in the optical disc drive in which the optical pickup is controlled to reach the target recording track by the velocity servo loop that is formed by detecting the moving velocity of the optical pickup, on the basis of the number of the remaining tracks to be seeked to the target recording track, the target velocity value is supplied to the velocity servo loop, whereby the moving velocity of the optical pickup can be controlled to become [0] at a timing (time point) in which the optical pickup reaches the target recording track.

Further, according to the present invention, when there are a very few tracks to be seeked by the optical pickup, the bang-bang control circuit performs the bang-bang control for the optical pickup. Thus, when there are a few tracks to be seeked, the seek control operation can be carried out positively by the simplified arrangement.

Therefore, since the tracking control can be performed immediately after the optical pickup has finished the seek operation, it is possible to realize the optical disc drive of the simplified arrangement which can considerably reduce the time necessary for accessing on the whole.

It should be understood that the above description is presented by way of example on the preferred embodiments of the invention and it will be apparent that many modifications and variations thereof could be effected by one with ordinary skill in the art without departing from the spirit and scope of the novel concepts of the invention so that the scope of the invention should be determined only by the appended claims.

I claim as my invention:

1. An optical disc drive having a seek control circuit for driving an optical pickup to reach a target recording track, comprising:

(a) velocity feedback means for controlling the moving velocity of said optical pickup by detecting the velocity thereof;

(b) seek control means for calculating the number of remaining tracks to said target recording track during a seek operation in response to a signal derived from said optical pickup and for supplying a target velocity signal to said velocity feedback means in response to the calculated result;

(c) said seek control means including an up/down first counter and a digital-to-analog converter connected to said counter, and means for causing said counter to count up during the first one-half of said seek operation and for causing said counter to count downwardly during the second half of said seek operation, whereby said target velocity signal increases during the first half of said seek operation and decreases during the second half of said seek operation.

2. Apparatus according to claim 1, including means connected to the output of said up/down counter for modifying said target velocity signal, whereby said target velocity signal is partially responsive to the content of said counter, and including emphasis means for increasing said target velocity signal during the first half of said seek operation.

3. Apparatus according to claim 2, wherein said emphasis means incorporates means for deriving an emphasis signal proportional to the content of said counter, and means for adding said emphasis signal to the output of said digital-to-analog converter.

4. Apparatus according to claim 2, including bang-bang control means for modifying said target velocity signal by abruptly increasing said target velocity signal for a limited time period at the beginning of said seek operation, and for abruptly reducing the value of said target velocity signal for a limited time period at the beginning of the second half of said seek operation.

5. Apparatus according to claim 1, including another counter, presetting means for periodically presetting said another counter in accordance with the state of said up/down counter, means for modifying the count of said another counter in response to movement of said optical pickup across a track toward said target track, and means for supplying pulses to said up/down counter in response to the count of said another counter reaching a predetermined value, said presetting means being operative to preset said another counter after said another counter reaches said predetermined value.

* * * * *